(12) United States Patent
Lu et al.

(10) Patent No.: US 9,947,610 B2
(45) Date of Patent: Apr. 17, 2018

(54) SEMICONDUCTOR STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Shiang-Chin Lu, Hsinchu (TW); Chien-Chih Wu, Taoyuan (TW); Jer-Shien Yang, Hsinchu (TW); Hung-Wen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/009,757

(22) Filed: Jan. 28, 2016

(65) Prior Publication Data

US 2017/0221794 A1  Aug. 3, 2017

(51) Int. Cl.
*H01L 29/40* (2006.01)
*H01L 23/48* (2006.01)
*H01L 21/3065* (2006.01)
*H01L 21/768* (2006.01)
*H01L 23/532* (2006.01)

(52) U.S. Cl.
CPC ........ *H01L 23/481* (2013.01); *H01L 21/3065* (2013.01); *H01L 21/76831* (2013.01); *H01L 21/76864* (2013.01); *H01L 21/76898* (2013.01); *H01L 23/5329* (2013.01); *H01L 23/53228* (2013.01)

(58) Field of Classification Search
CPC ............ H01L 23/481; H01L 21/76831; H01L 23/5329; H01L 21/76898; H01L 21/3065; H01L 23/53228; H01L 21/76864
See application file for complete search history.

(56) References Cited

U.S. PATENT DOCUMENTS

| | | | |
|---|---|---|---|
| 9,768,191 B2 * | 9/2017 | Hu | H01L 27/11582 |
| 2001/0000115 A1 * | 4/2001 | Greco | H01L 21/31116 |
| | | | 257/773 |
| 2006/0226412 A1 * | 10/2006 | Saxler | H01L 21/0237 |
| | | | 257/11 |
| 2008/0283937 A1 * | 11/2008 | Shin | H01L 21/7682 |
| | | | 257/408 |
| 2012/0094437 A1 * | 4/2012 | Han | H01L 21/76801 |
| | | | 438/109 |
| 2012/0292687 A1 * | 11/2012 | Lin | H01L 29/0634 |
| | | | 257/329 |
| 2016/0027796 A1 * | 1/2016 | Yang | H01L 27/11573 |
| | | | 257/314 |
| 2017/0011925 A1 * | 1/2017 | Liao | H01L 21/283 |

* cited by examiner

*Primary Examiner* — Victor A Mandala
(74) *Attorney, Agent, or Firm* — Maschoff Brennan

(57) ABSTRACT

A semiconductor structure includes a semiconductor substrate, a dielectric layer, a buffer layer, at least one recess, and at least one conductor. The dielectric layer is present on the semiconductor substrate. The buffer layer is present between the semiconductor substrate and the dielectric layer. The recess extends into the semiconductor substrate through the dielectric layer and the buffer layer, in which the buffer layer has a removing rate with respect to an etching process for forming the recess. The removing rate of the buffer layer is between those of the semiconductor substrate and the dielectric layer. The conductor is present in the recess.

20 Claims, 7 Drawing Sheets

SEMICONDUCTOR STRUCTURE AND METHOD FOR MANUFACTURING THE SAME

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
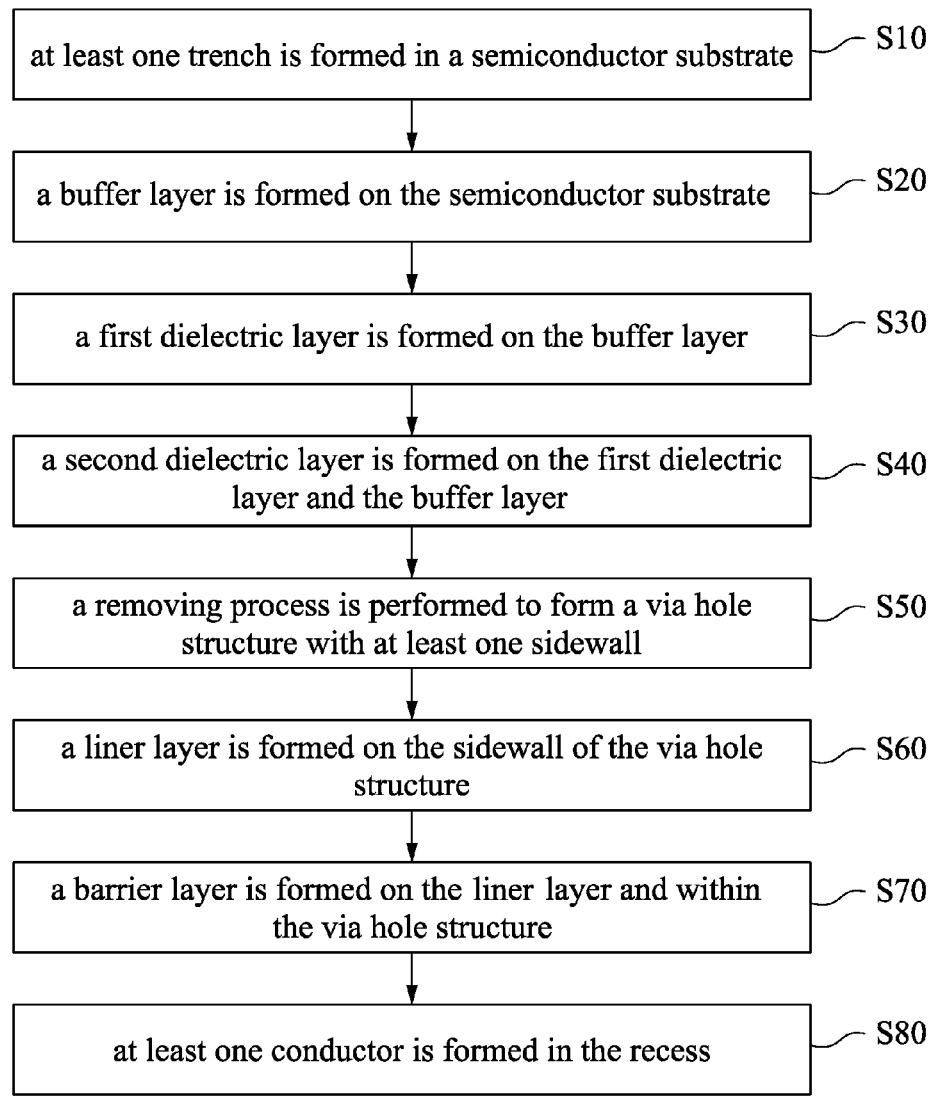
FIG. 1 is a flowchart of operations of a method for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, operations, elements, and/or components, but do not preclude the presence or addition of one or more other features, regions, integers, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a flowchart of operations S10-S80 of a method for manufacturing a semiconductor structure in accordance with some embodiments of the present disclosure. The method begins with operation S10 in which at least one trench is formed in a semiconductor substrate. The method continues with operation S20 in which a buffer layer is formed on the semiconductor substrate. The method continues with operation S30 in which a first dielectric layer is formed on the buffer layer. The method continues with operation S40 in which a second dielectric layer is formed on the first dielectric layer and the buffer layer. The method continues with operation S50 in which a removing process is performed to form at least one via hole structure with at least one sidewall. The method continues with operation S60 in which a liner layer is formed on the sidewall of the via hole structure. The method continues with operation S70 in which a barrier layer is formed on the liner layer and within the via hole structure. The method continues with operation S80 in which at least one conductor is formed in the via hole structure.

FIGS. 2A-2L are cross-sectional views of the method for manufacturing the semiconductor structure 100 in accordance with some embodiments of the present disclosure. The operations S10-S80 mentioned above are respectively illustrated in FIGS. 2A-2L.

Figure 2A:
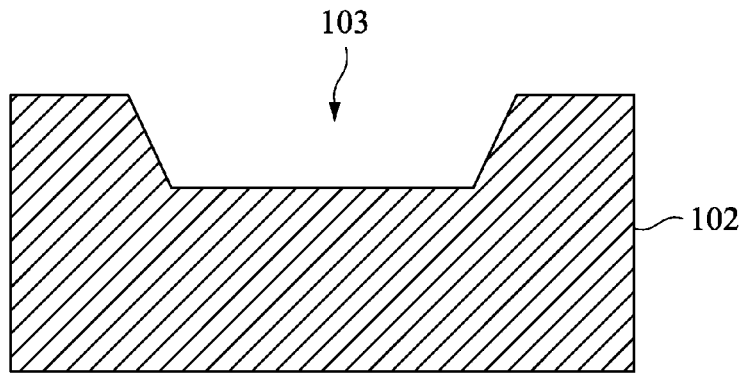
FIGS. 2A-2L are cross-sectional views of the method for manufacturing the semiconductor structure in accordance with some embodiments of the present disclosure.

Reference is made to FIG. 2A. At least one trench 103 is formed in a semiconductor substrate 102 (the operation S10 in FIG. 1). After the forming the trench 103, the semiconductor substrate 102 has the trench 103 therein. In some embodiments, the semiconductor substrate 102 may be made of a semiconductor material, such as silicon, silicon carbide (SiC), silicon germanium (SiGe), an III-V compound semiconductor, combinations thereof, or the like. In some embodiments, the trench 103 is formed by a reactive-ion etching (RIE) method. In some embodiments, the trench 103 is a part of at least one isolation region, such as a shallow trench isolation (STI) region. Thus, the trench 103 is formed in the semiconductor substrate 102 and is used to define an active region of a semiconductor device, such as a metal-oxide-semiconductor (MOS) device in accordance with some embodiments.

Figure 2B:
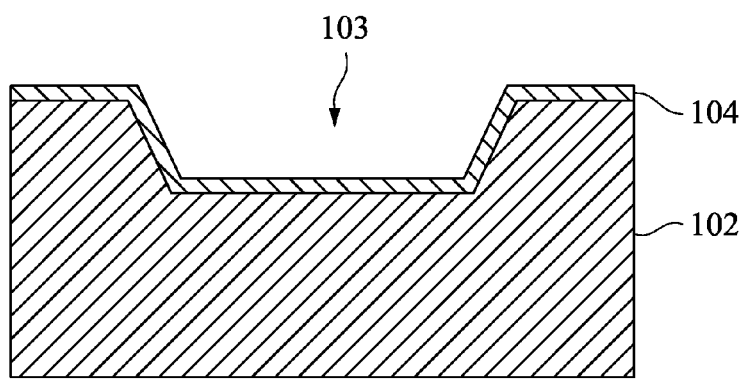

Reference is made to FIG. 2B. A buffer layer 104 is formed on the semiconductor substrate 102 (the operation S20 in FIG. 1), in which the buffer layer 104 is formed on at least one sidewall and a bottom surface of the trench 103 of the semiconductor substrate 102. In some embodiments, a top surface of the semiconductor substrate 102 (i.e., the surface faces the trench 103) is covered with the buffer layer 104. In some embodiments, the buffer layer 104 formed on the semiconductor substrate 102 is concave-shaped. In some embodiments, the buffer layer 104 is made of silicon, silicon carbide (SiC) or silicon nitride (SiN). The available formation methods for forming the buffer layer 104 include plasma enhanced chemical vapor deposition (PECVD), low-pressure chemical vapor deposition (LPCVD), sub-atmospheric chemical vapor deposition (SACVD), and other deposition methods. In some embodiments, the semiconductor substrate 102 and the buffer layer 104 are made of different materials.

Figure 2C:
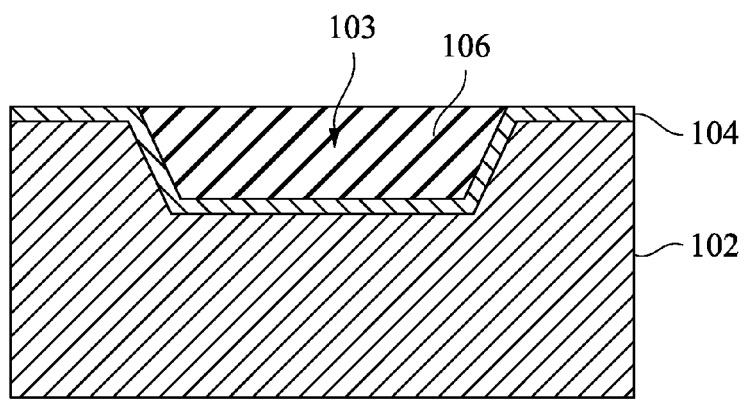

Reference is made to FIG. 2C. A first dielectric layer 106 is formed on the buffer layer 104 (the operation S30 in FIG. 1), in which the first dielectric layer 106 is formed in the trench 103. In some embodiments, uppermost surfaces of the buffer layer 104 and the first dielectric layer 106 (i.e., the surface of the buffer layer 104 that is outside of the trench 103 and faces away from the semiconductor substrate 102 and the surface of the first dielectric layer 106 that faces away from the semiconductor substrate 102) are substantially coplanar. In some embodiments, the first dielectric layer 106 is present in the trench 103 to form a STI structure.

In the formation of the first dielectric layer 106, the first dielectric layer 106 may overfill the trench 103, and thus the uppermost surface of the buffer layer 104 is covered with the first dielectric layer 106. Next, a planarization process is performed on the first dielectric layer 106 until the buffer layer 104 is exposed, such that the uppermost surfaces of the buffer layer 104 and the first dielectric layer 106 are substantially coplanar. In some embodiments, the first dielectric layer 106 is formed by chemical vapor deposition (CVD), and the planarization process includes a chemical mechanical planarization (CMP) process. In some embodiments, the first dielectric layer 106 is made of, for example, silicon oxide ($SiO_2$), silicon oxynitride ($SiO_xN_y$), silicon nitride (SiN), an oxide material, a nitride material, or combinations thereof.

Figure 2D:
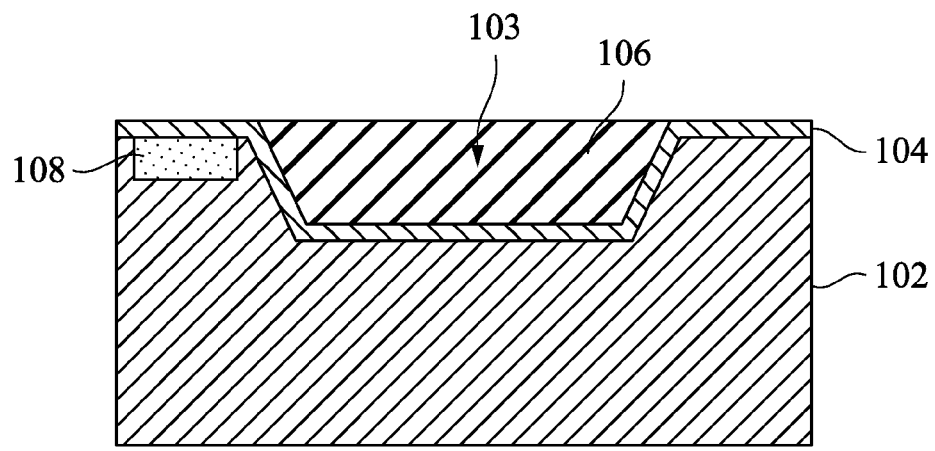

Reference is made to FIG. 2D. A contact region 108 is formed in or on the semiconductor substrate 102. In some embodiments, the contact region 108 is present outside of the trench 103. In some embodiments, vertical projections of the first dielectric layer 106 and the contact region 108 on the buffer layer 104 are independent of each other. In some embodiments, the contact region 108 may be a contact region for component of a semiconductor device, such as, transistors, diodes, and the like for fabricating an integrated circuit.

Figure 2E:
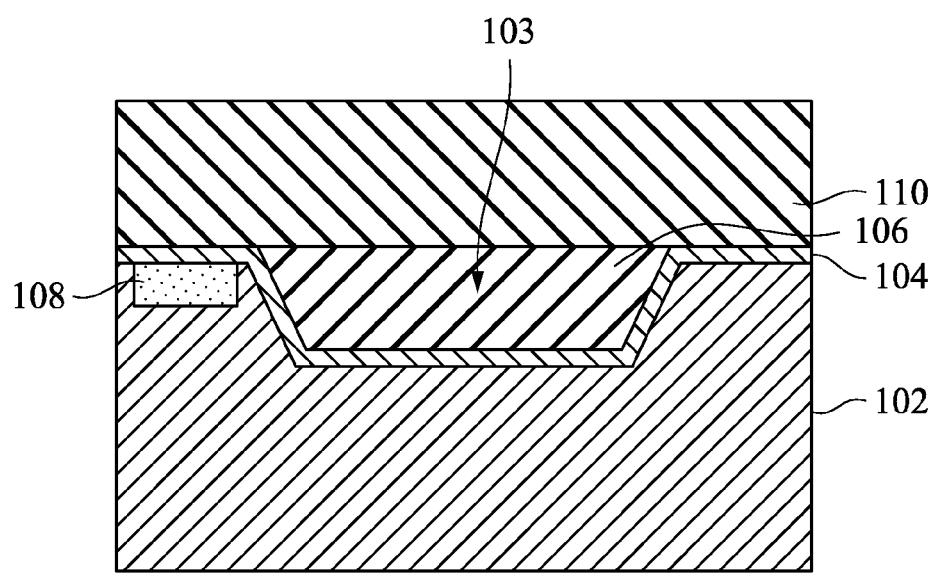

Reference is made to FIG. 2E. A second dielectric layer 110 is formed on the first dielectric layer 106 and the buffer layer 104 (the operation S40 in FIG. 1). In some embodiments, a surface of the second dielectric layer 110 facing the semiconductor substrate 102 is connected to the uppermost surfaces of the buffer layer 104 and the first dielectric layer 106. In some embodiments, the buffer layer 104 and the first dielectric layer 106 are covered with the second dielectric layer 110. In some embodiments, the second dielectric layer 110 serves as an interlayer dielectric layer. In some embodiments, the second dielectric layer 110 is formed by a CVD process. In some embodiments, the second dielectric layer 110 is made of, for example, silicon oxide ($SiO_2$), silicon oxynitride ($SiO_xN_y$), silicon nitride (SiN), an oxide material, a nitride material, or combinations thereof.

Figure 2F:
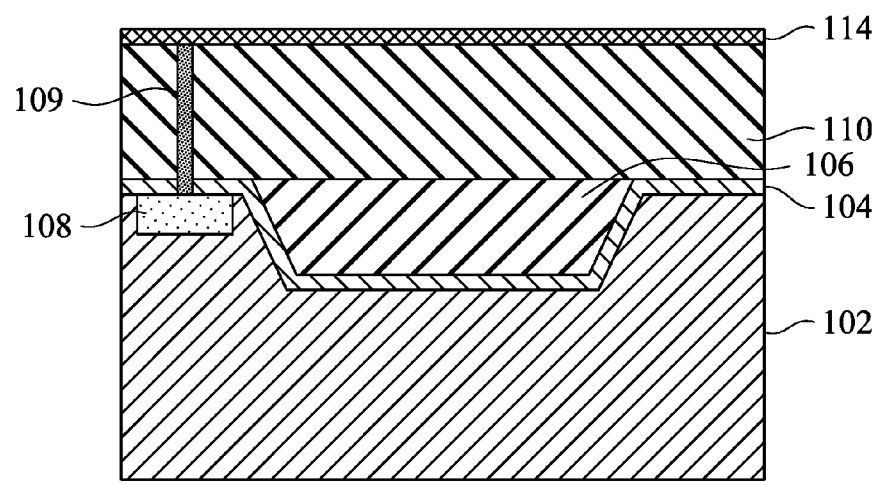

Reference is made to FIG. 2F. A contact plug 109 is formed through the second dielectric layer 110 serving as the interlayer dielectric layer. In some embodiments, the contact plug 109 is formed to electrically connect to the contact region 108, in which uppermost surfaces of the contact plug 109 and the second dielectric layer 110 (i.e., the surface of the second dielectric layer 110 that faces away from the semiconductor substrate 102 and the surface of the contact plug 109 that faces away from the semiconductor substrate 102) are substantially coplanar. In some embodiments, the contact plug 109 is made of a conductive material, such as metal. In some embodiments, in the formation of the contact plug 109, a via is formed in the second dielectric layer 110 and the buffer layer 104 to expose the contact region 108. Next, the conductive material, such as tungsten (W), overfills the via, and then a planarization process is performed to remove the excess conductive material outside the via to form the contact plug 109. Next, in some embodiments, a polish stop layer 114 is formed on the second dielectric layer 110, in which the polish stop layer 114 is present on the uppermost surface of the second dielectric layer 110. In some embodiments, the polish stop layer 114 is made of silicon carbide (SiC).

Figure 2G:
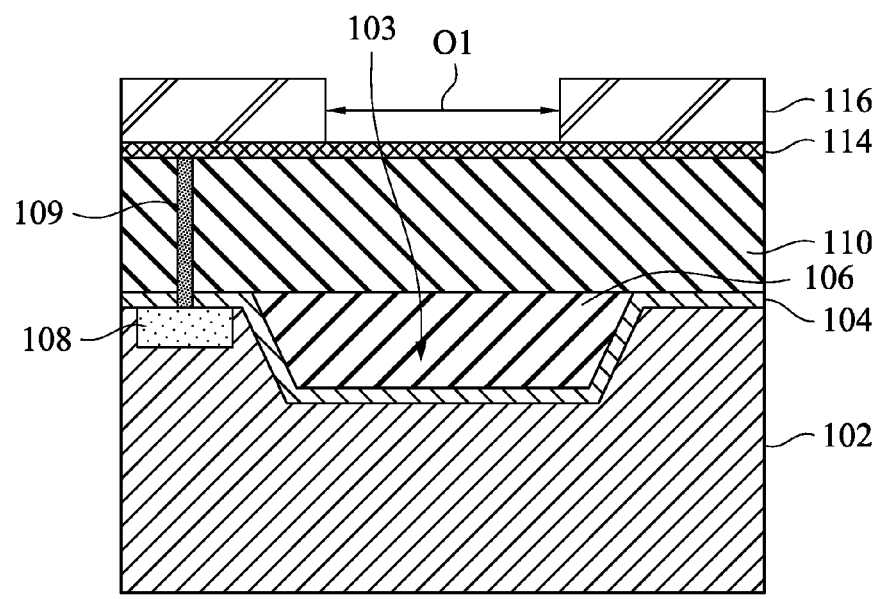

Reference is made to FIG. 2G. In some embodiments, after forming the polish stop layer 114, a subsequent process performed on a combination of the polish stop layer 114, the second dielectric layer 110, the first dielectric layer 106, the buffer layer 104, and the semiconductor substrate 102 is a removing process, in which the removing process is performed to form at least one via hole structure in the combination. In some embodiments, in order to perform the removing process, a photoresist layer 116 is formed on the polish stop layer 114, in which the photoresist layer 116 is patterned to have an opening O1 therein. Thus, a portion of the polish stop layer 114 is exposed by the opening O1. In some embodiments, a vertical projection of the opening O1 of the photoresist layer 116 on the semiconductor substrate 102 is present within the trench 103 of the semiconductor substrate 102. In some embodiments, the vertical projection of the opening O1 of the photoresist layer 116 on the semiconductor substrate 102 is present within a vertical projection of the first dielectric layer 106 on the semiconductor substrate 102.

In some embodiments, the photoresist layer 116 is applied onto the polish stop layer 114 by spin coating. The photoresist layer 116 is then prebaked to drive off excess photoresist solvent. After prebaking, the photoresist layer 116 is exposed to a pattern of intense light. The exposure to light causes a chemical change that allows some of the photoresist layer 116 soluble in a photographic developer. In some embodiments, a post-exposure bake (PEB) may be performed before developing to help reduce standing wave phenomena caused by the destructive and constructive interference patterns of the incident light. The photographic developer is then applied onto the photoresist layer 116 to remove the some of the photoresist layer 116 soluble in the photographic developer, and the opening O1 of the photoresist layer 116 is formed after removing the some of the photoresist layer 116. The remaining photoresist layer 116 is then hard-baked to solidify the remaining photoresist layer 116.

Figure 2H:
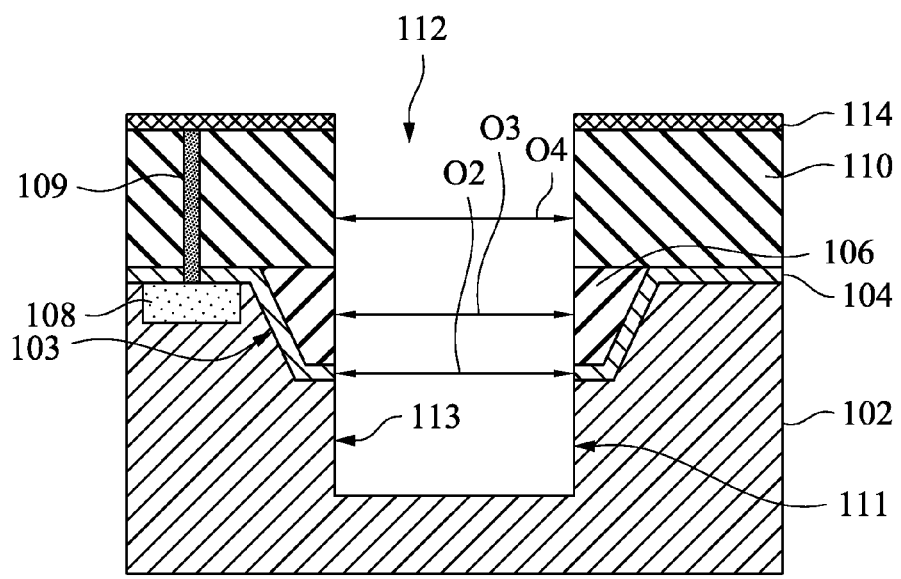

Reference is made to FIG. 2H. The removing process is performed (the block S50 in FIG. 1). In the removing process, the polish stop layer 114, the second dielectric layer 110, the first dielectric layer 106, the buffer layer 104, and the semiconductor substrate 102 are patterned through the photoresist layer 116 (see FIG. 2G) having the opening O1, such that a recess 111 through the semiconductor substrate 102, an opening O2 through the buffer layer 104, an opening O3 through the first dielectric layer 106, and an opening O4 through the second dielectric layer 110 are formed. In some embodiments, a combination of the openings O2-O4 and the recess 111 is a via hole structure 112 with at least one sidewall 113, in which the via hole structure 112 extends into the semiconductor substrate 102 through the second dielectric layer 110, the first dielectric layer 106, and the buffer layer 104.

Explained in a different way, the via hole structure 112 is formed within the opening O1 of the photoresist layer 116 (see FIG. 2G) by removing a portion of the polish stop layer 114, a portion of the second dielectric layer 110, a portion of the first dielectric layer 106, a portion of the buffer layer 104, and a portion of the semiconductor substrate 102 in sequence. Thereafter, the photoresist layer 116 (see FIG. 2G) is removed to result in the structure of FIG. 2H. In some embodiments, the first dielectric layer 106 present in the trench 103 (see FIG. 2G) is formed as the STI structure that provides electrical isolation between adjacent semiconductor devices. In embodiments in which the first dielectric layer 106 is made of an oxide material, the first dielectric layer 106 present in the trench 103 (see FIG. 2G) is formed as the STI oxide.

In some embodiments, after the recess 111 is formed, the semiconductor substrate 102 has the recess 111 therein, the buffer layer 104 has the opening O2 therein, the first dielectric layer 106 has the opening O3 therein, and the second dielectric layer 110 has the opening O4 therein, in which the opening O4 of the second dielectric layer 110, the opening O3 of the first dielectric layer 106, the opening O2 of the buffer layer 104, and the recess 111 of the semiconductor substrate 102 communicate with each other. In some embodiments, the via hole structure 112 formed by the combination of the openings O2-O4 and the recess 111 is a through-substrate via (TSV). In some embodiments, vertical projections of the opening O2 of the buffer layer 104, the opening O3 of the first dielectric layer 106, the opening O4 of the second dielectric layer 110 on the semiconductor substrate 102 are present at the same region of a bottom surface of the via hole structure 112. In some embodiments, a depth of the via hole structure 112 is in a range from about 80 um to about 120 um.

In some embodiments, the removing process is used for forming the via hole structure 112 extending into the semiconductor substrate 102 through the second dielectric layer 110, the first dielectric layer 106, and the buffer layer 104. In some embodiments, the buffer layer 104 has a removing rate with respect to the process of forming the via hole structure 112, and the removing rate of the buffer layer 104 is between those of the semiconductor substrate 102 and the first dielectric layer 106, for example, an etching process. The removing rate of the buffer layer 104 is less than the removing rate of the semiconductor substrate 102, and the removing rate of the buffer layer 104 is greater than the removing rate of the first dielectric layer 106. In some embodiments, the semiconductor substrate 102 is made of silicon, the buffer layer 104 is made of silicon carbide (SiC), silicon nitride (SiN) or combinations thereof, and the first dielectric layer 106 is made of an oxide material. In some embodiments, the second dielectric layer 110 is made of an oxide material as well, and thus the removing rates of the first dielectric layer 106 and the second dielectric layer 110 are similar to each other. Therefore, the removing rate of the buffer layer 104 is greater than the removing rate of the second dielectric layer 110 as well"

Since the removing rate of the buffer layer 104 is between the removing rate of the semiconductor substrate 102 and the removing rate of the first dielectric layer 106, the sidewall 113 of the via hole structure 112 is smoothly formed at an interface between the buffer layer 104 and the first dielectric layer 106 and an interface between the semiconductor substrate 102 and the buffer layer 104. Explained in a different way, since the removing rate of the buffer layer 104 is between the removing rate of the semiconductor substrate 102 and the removing rate of the first dielectric layer 106, the buffer layer 104 provides a buffer effect such that a side recess is prevented from being formed on the sidewall 113 of the via hole structure 112 near the interface between two layers connecting each other, namely, near the interface between the semiconductor substrate 102 and buffer layer 104 and near the interface between the buffer layer 104 and the first dielectric layer 106.

In some embodiments, the removing process used for forming the via hole structure 112 includes an etching process, for example, deep reactive-ion etching (DRIE). In such embodiments in which the removing process is performed by an etching process, the semiconductor substrate 102, the buffer layer 104, and the first dielectric layer 106 and the second dielectric layer 110 are etched by an etchant. In such embodiments where an etchant is used, the buffer layer 104 has an etch resistance, in which the etch resistance of the buffer layer 104 is between those of the semiconductor substrate 102 and the first dielectric layer 106. In some embodiments, the etch resistance of the buffer layer 104 is greater than the etch resistance of the semiconductor substrate 102, and the etch resistance of the buffer layer 104 is less than the etch resistance of the first dielectric layer 106. In addition, in some embodiments, the second dielectric layer 110 has an etch resistance, and the etch resistances of the first dielectric layer 106 and the second dielectric layer 110 are similar to each other. Thus, the etch resistance of the buffer layer 104 is less than the etch resistance of the second dielectric layer 110 as well.

In addition, in embodiments where the removing process is performed by DRIE, a time-sequenced etch and passivate chemistry are used, in which a method of using the time-sequenced etch and the passivate chemistry is a bosch deep reactive-ion etching (bosch DRIE) method. In embodiments where the bosch DRIE method is used, high-density plasma etching and passivation layer formation on the sidewall 113 of the via hole structure 112 formed by the combination of the openings O2-O4 and the recess 111 are alternately performed, in which sulfur hexafluoride ($SF_6$) is used as an etching gas and octafluorocyclobutane ($C_4F_8$) is used as a base of a passivation layer.

Explained in a different way, in some embodiments, the bosch DRIE method includes a pulsed etching process involving alternating steps of isotropic etching and passivation, and the alternating steps are repeated until the desired depth of the via hole structure 112 is reached. Thus, the plasma in the bosch DRIE method contains some ions which attack the target substrate (for example, the semiconductor substrate 102, the buffer layer 104, the first dielectric layer 106, and the second dielectric layer 110) from a nearly vertical direction. In some embodiments, the passivation layer protects the entire target substrate from further chemical attack and prevents further (lateral) etching. However, during the etching process, the directional ions that bombard the target substrate attack the passivation layer at the bottom but not along the sides. In some embodiments, the isotropic etching and passivation steps are repeated many times. Moreover, the cycle time is related to various properties. For example, short cycles yield smoother sidewalls, and long cycles yield a higher etch rate.

Figure 2I:
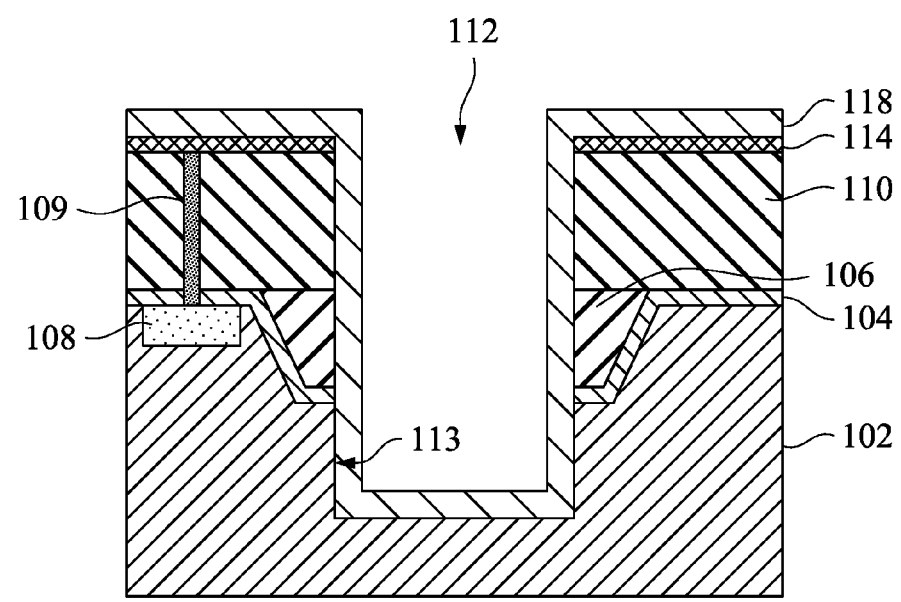

Reference is made to FIG. 2I. A liner layer 118 (the block S60 in FIG. 1) is formed on the sidewall 113 of the via hole structure 112 and on the polish stop layer 114. In some embodiments, the liner layer 118 is made of silicon oxide ($SiO_2$) or carbon-doped silicon oxide (SiOC). In some embodiments, the liner layer 118 is formed using tetraethyl orthosilicate (TEOS) or ozone TEOS.

Figure 2J:
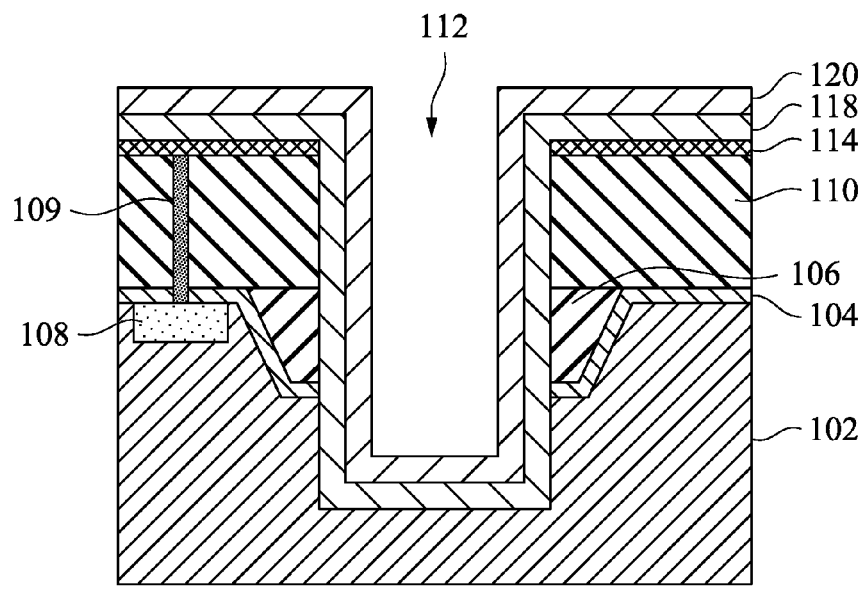

Reference is made to FIG. 2J. A barrier layer 120 (the block S70 in FIG. 1) is formed on the liner layer 118 and within the via hole structure 112. In some embodiments, the barrier layer 120 is made of metal or metal nitride such as tantalum (Ta), tantalum nitride (TaN), titanium (Ti), titanium nitride (TiN), ruthenium (Ru), cobalt (Co), nickel (Ni), nickel boride, tungsten nitride, and the like, alone or in a combination thereof.

Figure 2K:
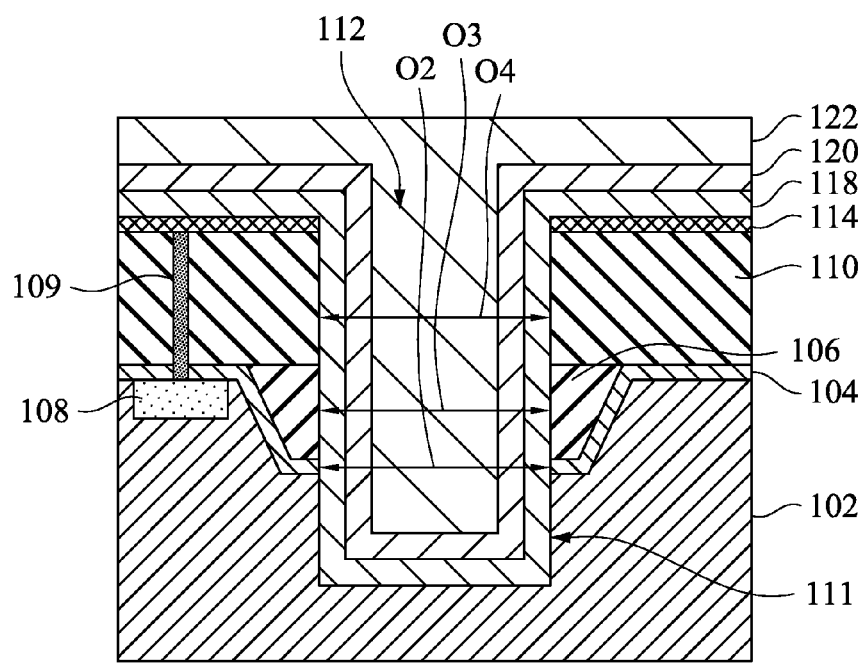

Reference is made to FIG. 2K. At least one conductor 122 is formed in the via hole structure 112 (the block S80 in FIG. 1). In some embodiments, the conductor 122 is present on the barrier layer 120 and within the via hole structure 112 formed by the combination of the openings O2-O4 and the recess 111.

In some embodiments, the conductor 122 is formed from a seed layer (not shown). In such embodiments in which the conductor 122 is formed from a seed layer, the seed layer is formed on the barrier layer 120 to allow for the formation of the conductor 122 therefrom. In some embodiments, the seed layer is made of copper formed by a physical vapor deposition (PVD) process. Through such a process, the conductor 122 is formed from the seed layer to fill the remaining portions of the via hole structure 112 formed by the combination of the openings O2-O4 and the recess 111 after the seed layer has been formed on the barrier layer 120. In some embodiments, the conductor 122 is made of metal having a low resistance, such as copper, and is formed by an electroplating process, an electroless plating process, an electrografting process, a PVD process, and the like.

In some embodiments, a further heat treatment process is performed with the conductor 122, in which the heat treatment process includes an annealing process. In embodiments where the conductor 122 is made of copper, a temperature of the annealing process is in a range form about 300° C. to about 500° C., and a duration of the annealing process is in a range form about 10 to about 60 minutes. This annealing process relieves stresses formed during the formation of the conductor 122 made of copper.

Figure 2L:
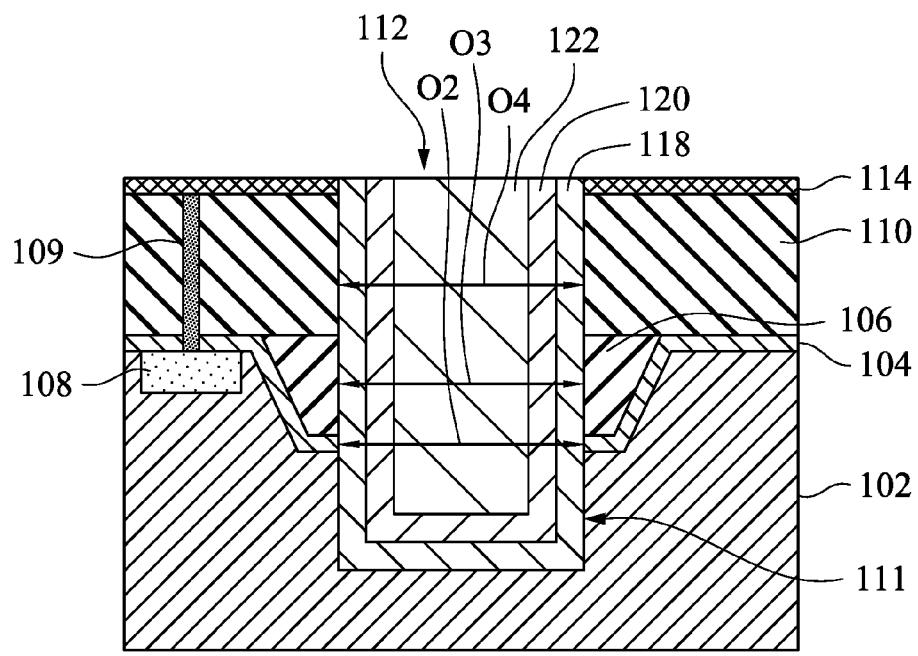

Reference is made to FIG. 2L. A planarization process is performed. In some embodiments, structures present above the polish stop layer 114 are performed by the planarization process. In some embodiments, the planarization process includes a CMP process, and the polish stop layer 114 serves as a CMP stop layer. In some embodiments, the planarization process is performed with the liner layer 118, the barrier layer 120, and the conductor 122 present on the polish stop layer 114 until the polish stop layer 114 is exposed, such that the uppermost surfaces of the polish stop layer 114 and the conductor 122 are substantially coplanar. After the planarization process is performed, the structure illustrated in FIG. 2L is obtained and is the semiconductor structure 100 mentioned above. The semiconductor structure 100 includes the semiconductor substrate 102, the buffer layer 104, the first dielectric layer 106, the second dielectric layer 110, the polish stop layer 114, the liner layer 118, the barrier layer 120, and the conductor 122. The semiconductor structure 100 has the via hole structure 112 extending into the semiconductor substrate 102 through the second dielectric layer 110, the first dielectric layer 106, and the buffer layer 104. The semiconductor substrate 102 has the recess 111 therein. The buffer layer 104 present between the semiconductor substrate 102 and the first dielectric layer 106 has the opening O2 therein. The first dielectric layer 106 present on the semiconductor substrate 102 has the opening O3 therein. The second dielectric layer 110 present on the semiconductor substrate 102 has the opening O4. Furthermore, as described above, the via hole structure 112 is the TSV in accordance with some embodiments. The conductor 122 is present at least in the via hole structure 112.

As described above, in the semiconductor structure, since the removing rate of the buffer layer is between the removing rate of the semiconductor substrate and the removing rate of the first dielectric layer, the formation of the side recess on the sidewall of the via hole structure near the interface between two layers connecting each other is prevented. Therefore, with this structure, after the conductor is formed, even if the conductor expands and produces a stress against one of the semiconductor substrate, the buffer layer, the first dielectric layer, and the second dielectric layer, a situation in which the stress leads to cracking of one of the semiconductor substrate, the buffer layer, the first dielectric layer, and the second dielectric layer is also prevented. Thus, a situation in which the conductor expands and produces a stress against the sidewall of the via hole structure between the semiconductor substrate and the STI structure is prevented, and ultimately, a crack expanding from the sidewall of the via hole structure is avoided.

According to various embodiments of the present disclosure, a semiconductor structure includes a semiconductor substrate, a dielectric layer, a buffer layer, at least one recess, and at least one conductor. The dielectric layer is present on the semiconductor substrate. The buffer layer is present between the semiconductor substrate and the dielectric layer. The recess extends into the semiconductor substrate through the dielectric layer and the buffer layer, in which the buffer layer has a removing rate with respect to an etching process for forming the recess. The removing rate of the buffer layer is between those of the semiconductor substrate and the dielectric layer. The conductor is present in the recess.

According to various embodiments of the present disclosure, a semiconductor structure includes a semiconductor substrate, a buffer layer, a dielectric layer, and at least one conductor. The semiconductor substrate has at least one recess therein. The buffer layer present on the semiconductor substrate has at least one opening therein. The dielectric layer present on the buffer layer has at least one opening therein. The opening of the dielectric layer, the opening of the buffer layer, and the recess of the semiconductor substrate communicate with each other. The buffer layer has an etch resistance to an etchant used to etch the recess, and the etch resistance of the buffer layer is between those of the semiconductor substrate and the dielectric layer. The conductor is present at least in the recess.

According to various embodiments of the present disclosure, a method for manufacturing a semiconductor structure is provided. The method includes forming a buffer layer on a semiconductor substrate, forming a dielectric layer on the buffer layer, and forming at least one recess in the semiconductor substrate through the buffer layer and the dielectric layer. The buffer layer has a removing rate with respect to the forming the recess, and the removing rate of the buffer layer is between those of the semiconductor substrate and the dielectric layer. At least one conductor is formed in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   a dielectric layer present on the semiconductor substrate;
   a buffer layer present between the semiconductor substrate and the dielectric layer;
   at least one recess extending into the semiconductor substrate through the dielectric layer and the buffer layer, wherein the buffer layer has a removing rate with respect to an etching process for forming the recess, and the removing rate of the buffer layer is between those of the semiconductor substrate and the dielectric layer; and
   at least one conductor present in the recess, wherein the semiconductor substrate is spaced apart from the entire dielectric layer.

2. The semiconductor structure of claim 1, wherein the removing rate of the buffer layer is less than that of the semiconductor substrate.

3. The semiconductor structure of claim 1, wherein the removing rate of the buffer layer is greater than that of the dielectric layer.

4. The semiconductor structure of claim 1, wherein the semiconductor substrate has at least one trench therein, and the dielectric layer is present in the trench to form a shallow trench isolation structure.

5. The semiconductor structure of claim 1, wherein the semiconductor substrate is made of silicon, the buffer layer is made of silicon carbide (SiC), silicon nitride (SiN) or combinations thereof, and the dielectric layer is made of an oxide material.

6. The semiconductor structure of claim 1, wherein the buffer layer is in contact with the semiconductor substrate.

7. The semiconductor structure of claim 6, wherein the dielectric layer is in contact with the buffer layer.

8. The semiconductor structure of claim 1, further comprising:
   an insulator present in the recess, wherein the recess is filled with a combination of the conductor and the insulator.

9. The semiconductor structure of claim 1, further comprising:
   a liner layer between the conductor and the buffer layer, and in contact with sidewalls of the dielectric layer, the buffer layer, and the semiconductor substrate.

10. A semiconductor structure, comprising:
    a semiconductor substrate having at least one recess therein;
    a buffer layer present on the semiconductor substrate and having at least one opening therein;
    a dielectric layer present on the buffer layer and having at least one opening therein, wherein an entirety of the dielectric layer is over the semiconductor substrate, wherein the opening of the dielectric layer, the opening of the buffer layer, and the recess of the semiconductor substrate communicate with each other, the buffer layer has an etch resistance to an etchant used to etch the recess, and the etch resistance of the buffer layer is between those of the semiconductor substrate and the dielectric layer; and
    at least one conductor present at least in the recess.

11. The semiconductor structure of claim 10, wherein the etch resistance of the buffer layer is greater than that of the semiconductor substrate.

12. The semiconductor structure of claim 10, wherein the etch resistance of the buffer layer is less than that of the dielectric layer.

13. The semiconductor structure of claim 10, wherein the semiconductor substrate is made of silicon, the buffer layer is made of silicon carbide (SiC), silicon nitride (SiN), or combinations thereof, and the dielectric layer is made of an oxide material.

14. The semiconductor structure of claim 10, wherein the buffer layer is in contact with the semiconductor substrate.

15. The semiconductor structure of claim 14, wherein the dielectric layer is in contact with the buffer layer.

16. The semiconductor structure of claim 10, further comprising:
    an insulator present in the recess, wherein the recess is filled with a combination of the conductor and the insulator.

17. The semiconductor structure of claim 10, further comprising:
    a liner layer between the conductor and the buffer layer, and in contact with sidewalls of the dielectric layer, the buffer layer, and the semiconductor substrate.

18. A semiconductor structure, comprising:
    a semiconductor substrate;
    a dielectric layer present on the semiconductor substrate and having a first opening;
    a buffer layer present between the semiconductor substrate and the dielectric layer, the buffer layer having a second opening, wherein the buffer layer has a first portion, a second portion below the first portion, and a third portion between the first portion and the second portion;
    at least one recess extending into the semiconductor substrate and communicating with the first opening of the dielectric layer and the second opening of the buffer layer, wherein the buffer layer has a removing rate with respect to an etching process for forming the first opening, and the removing rate of the buffer layer is between those of the semiconductor substrate and the dielectric layer; and
    at least one conductor present in the recess, wherein the semiconductor substrate is spaced apart from the dielectric layer.

19. The semiconductor structure of claim 18, wherein the removing rate of the buffer layer is less than that of the semiconductor substrate.

20. The semiconductor structure of claim 18, wherein the removing rate of the buffer layer is greater than that of the dielectric layer.

* * * * *